United States Patent [19]
Taneya et al.

[11] Patent Number: 4,747,109
[45] Date of Patent: May 24, 1988

[54] SEMICONDUCTOR LASER ARRAY DEVICE

[75] Inventors: Mototaka Taneya, Nara; Mitsuhiro Matsumoto; Sadayoshi Matsui, both of Tenri; Seiki Yano, Kashihara, all of Japan

[73] Assignee: Sharp Kabushiki Kaisha, Osaka, Japan

[21] Appl. No.: 881,096

[22] Filed: Jul. 2, 1986

[30] Foreign Application Priority Data

Jul. 12, 1985 [JP] Japan ................... 60-154716

[51] Int. Cl.⁴ .............................................. H01S 3/19
[52] U.S. Cl. ...................................... 372/48; 372/44; 372/50; 357/17
[58] Field of Search .................. 372/44, 45, 46, 48, 372/50; 357/16, 17

[56] References Cited

FOREIGN PATENT DOCUMENTS 0010949 10/1979 European Pat. Off. .
57-93588 10/1982 Japan ................................. 357/17

OTHER PUBLICATIONS

Streifer et al., GaAs/GaAlAs Diode Lasers with Angled Pumping Stripes, 4/1978, pp. 223-226.

Primary Examiner—James W. Davie
Assistant Examiner—Xuan Vo
Attorney, Agent, or Firm—Ciotti & Murashige, Irell & Manella

[57] ABSTRACT

The laser device has a plurality of parallel index-waveguides. The intermediate regions of the waveguides are at an angle of inclination from a line perpendicular to each of both facets of the laser device. The ends of the waveguides are oriented orthogonally to the facets of the laser device.

1 Claim, 4 Drawing Sheets

SEMICONDUCTOR LASER ARRAY DEVICE

BACKGROUND OF THE INVENTION

1. Field of the Invention

This invention relates to a semiconductor laser array device which emits high-output power laser light with a single narrow beam.

2. Description of the Prior Art

Semiconductor laser devices which are useful as light sources of optical discs, laser printers, optical measuring systems, etc., must produce high output power. However, conventional semiconductor laser devices having a single waveguide structure can only produce a low output power, 60-70 mW at their best, even taking into account their window effects and/or the reflectivity control at their facets. In order to oscillate laser in a certain array mode (i.e., a 0° phase-shift mode, resulting in a single narrow beam in the higher output power), semiconductor laser array devices, in which a plurality of waveguides are disposed in a parallel manner to achieve an optical phase coupling between the adjacent waveguides, have been studied. However, the optical phase shift between the adjacent waveguides of these devices is, indeed, 180°, and output power light is emitted into a two beam fashion having a certain angle therebetween, resulting in a far-field pattern having two peaks. Thus, this laser light cannot be concentrated into a spot fashion by means of any optical lens. FIG. 6 shows a typical conventional semiconductor laser array device 9, which can be produced as follows: On the (001) face of a p-GaAs substrate 1, an n+-$Al_{0.1}Ga_{0.9}As$ current blocking layer 2 having a thickness of 0.7 $\mu$m and an n-GaAs surface-protective layer 3 having a thickness of 0.1 $\mu$m are successively formed by liquid phase epitaxy. Then, three straight channels 4 are formed in a parallel manner through the surface-protective layer 3 into the p-GaAs substrate 1. Each of the channels 4 has a width D1 of 4 $\mu$m and a depth D2 of about 1 $\mu$m. Therefore, the distance D3 from the center of one channel to that of the adjacent channel is 5 $\mu$m. These channels 4 are disposed at right angles to the (110) plane. On the surface-protective layer 3 including the channels 4, a p-$Al_{0.42}Ga_{0.58}As$ cladding layer 5 having a thickness of 0.2 $\mu$m, a p- or n- $Al_{0.14}Ga_{0.86}As$ active layer 6 having a thickness of 0.08 $\mu$m, an n-$Al_{0.42}Ga_{0.58}As$ cladding layer 7 having a thickness of 0.8 $\mu$m, and an n+-GaAs contact layer 8 having a thickness of 1.5 $\mu$m are successively formed by liquid phase epitaxy. Since the channels 4 are filled with the p-cladding layer 5, the surface of the p-cladding layer 5 becomes flat. Then, the upper face of the contact layer 8 and the back face of the substrate 1 are subjected to a vapor deposition treatment with metal materials and then heated to form ohmic contacts thereon made of alloys of the metal materials, followed by cleaving at the (110) plane of the wafer, resulting in a semiconductor laser array device 9.

The optical field distribution of beams oscillated by the laser array device 9 and the far-field pattern attained by the laser array device 9 are shown in FIGS. 8 and 9, respectively, indicating that the optical phase shift between the adjacent waveguides is 180°.

The reason why the conventional semiconductor laser array device 9 having a plurality of waveguides is operated in a 180° phase-shift mode is that laser light is absorbed by the optical coupling area between the adjacent waveguides, which makes threshold gain of the 180° phase-shift mode significantly low.

The above-mentioned phenomenon that the conventional laser array device 9 is operated in a 180° phase-shift mode can be also explained by reference to FIG. 10, which shows the independence threshold gain of all allowed array modes ($\nu=1$, 2 and 3) of a triple lasing filament array 9 on the difference in refractive index in the lateral direction. This independence is obtained by an analysis of the waveguides. It can be also seen from FIG. 10 that the conventional laser array device 9 selectively and stably oscillates laser light in a 180° phase-shift mode. As mentioned above, such a 180° phase-shift mode attains a far-field pattern having two peaks, which causes difficulty in the concentration of laser light into a spot fashion by means of any optical lens.

Moreover, the conventional laser array device 9 oscillates laser light in array modes other than the 0° phase-shift mode and the 180° phase-shift mode, thereby producing output light with a plurality of beams. In addition, two or more array modes are superposed without interference therebetween, thereby producing output light with thick beams.

The above-mentioned phenomena are unfavorable in the use of semiconductor laser array devices. Semiconductor laser array devices, which attain a single oscillation mode and oscillate output power light of a single beam, are required.

SUMMARY OF THE INVENTION

The semiconductor laser array device of this invention, which overcomes the above-discussed and numerous other disadvantages and deficiencies of the prior art, comprises a plurality of index-waveguides in a parallel manner, wherein said index-waveguides are at an angle of inclination from a line perpendicular to each of both facets of the laser array device.

Both end portions of each of said index-waveguides are, in a preferred embodiment, at right angles to the facets.

Thus, the invention described herein makes possible the objects of (1) providing a semiconductor laser array device which attains laser oscillation in a single mode; and (2) providing a semiconductor laser array device which attains output light with a single beam.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
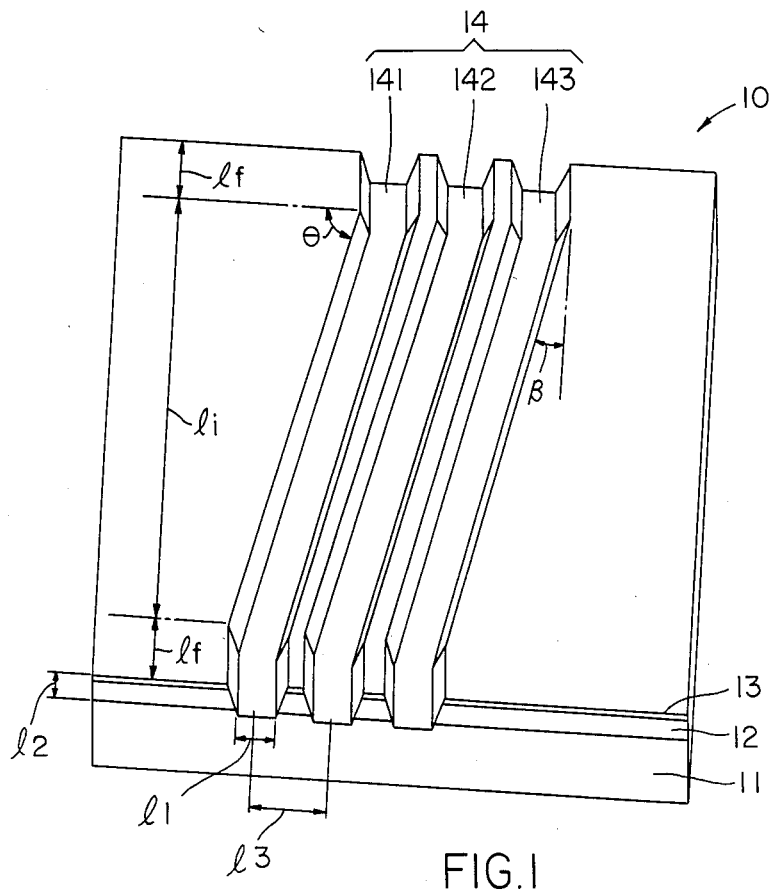
FIGS. 1 and 2, respectively, are a perspective view and a front sectional view showing a semiconductor laser array device of this invention.
Figure 2:
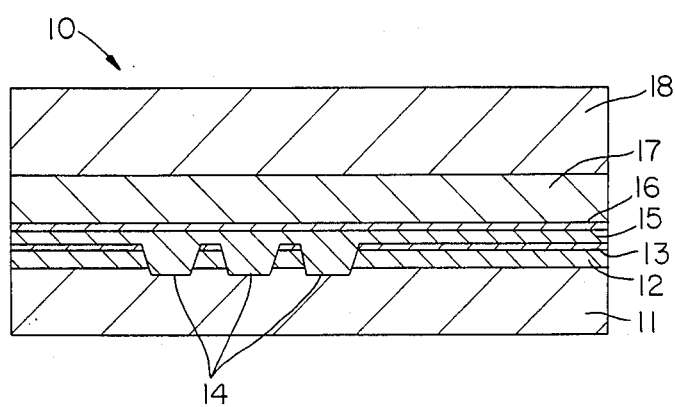

FIGS. 1 and 2 show a semiconductor laser array device 10 of this invention, which is produced as follows: On the (001) face of a p-GaAs substrate 11, an n+-$Al_{0.1}Ga_{0.9}As$ current blocking layer 12 having a thickness of 0.7 μm and an n-GaAs surface-protective layer 13 having a thickness of 0.1 μm are successively formed by liquid phase epitaxy. Then, three channels 14 are formed in a parallel manner through the surface-protective layer 13 into the substrate 11. The width l1 and the depth l2 of each of the channels 14 are 4 μm and approximately 1 μm, respectively. The distance l3 from the center of one channel to the center of the adjacent channel is 5 μm. The angle θ produced by each of the channels 14 (except for both end portion of each of the channels 14) and one of the facets of the device 10 can be represented by the following equations:

$$\theta = 90° - \beta (\beta \neq 0°) \quad (1)$$

$$l_3 \cdot \sin\beta = \lambda_0/2(N_{eff}-1) \quad (2)$$

wherein $\lambda_0$ is the oscillation wavelength of laser light and $N_{eff}$ is the effective refractive index in the laser array device with regard to the oscillation wavelength, and the end portion of each of the channels 14 is formed at right angles to each of the facets of the laser array device.

On the surface-protective layer 13 including the channels 14, a p-$Al_{0.42}Ga_{0.58}As$ cladding layer 15 having a thickness of 0.2 μm, a p- or n- $Al_{0.14}Ga_{0.86}As$ active layer 16 having a thickness of 0.08 μm, an n-$Al_{0.42}Ga_{0.58}As$ cladding layer 17 having a thickness of 0.8 μm, and an n+-GaAs contact layer 18 having a thickness of 1.5 μm are successively formed by liquid phase epitaxy. Since the channels 14 are filled with the p-cladding layer 15, the surface of the p-cladding layer 15 becomes flat. Then, the upper face of the contact layer 18 and the back face of the substrate 11 are subjected to a vapor deposition treatment with metal materials and heated to form ohmic contacts thereon made of alloys of the metal materials, followed by cleaving at the (011) plane of the wafer, resulting in a semiconductor laser array device 10.

Figure 3:
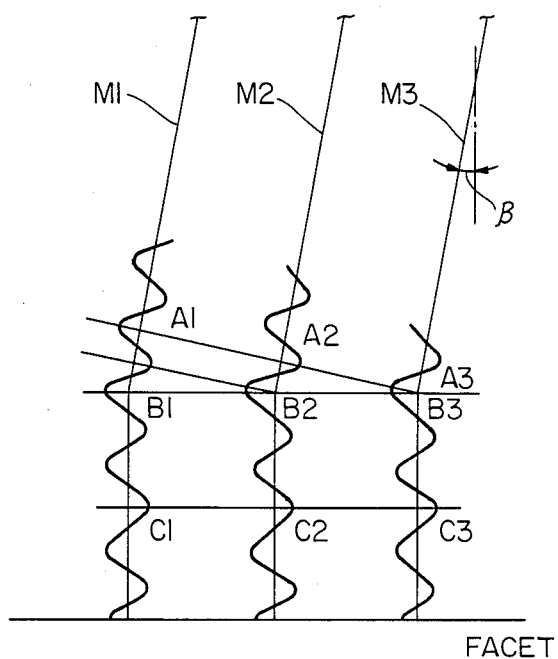
FIG. 3 is a schematic diagram showing the phase relationship between the opticalwaves at one facet of the semiconductor laser array device shown in FIG. 1.
Figure 4:
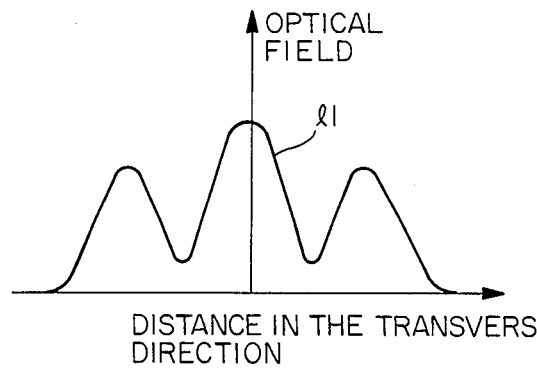
FIG. 4 is a graph showing the optical field distribution of the semiconductor laser array device shown in FIG. 1.
Figure 5:
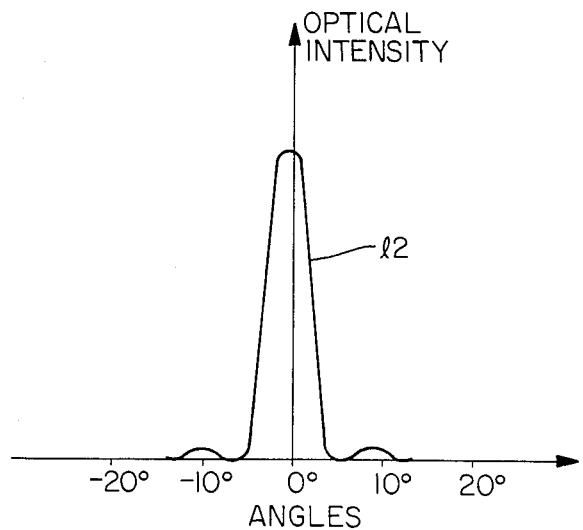
FIG. 5 is a graph showing the far-field pattern attained by the semiconductor laser array device shown in FIG. 1.
Figure 6:
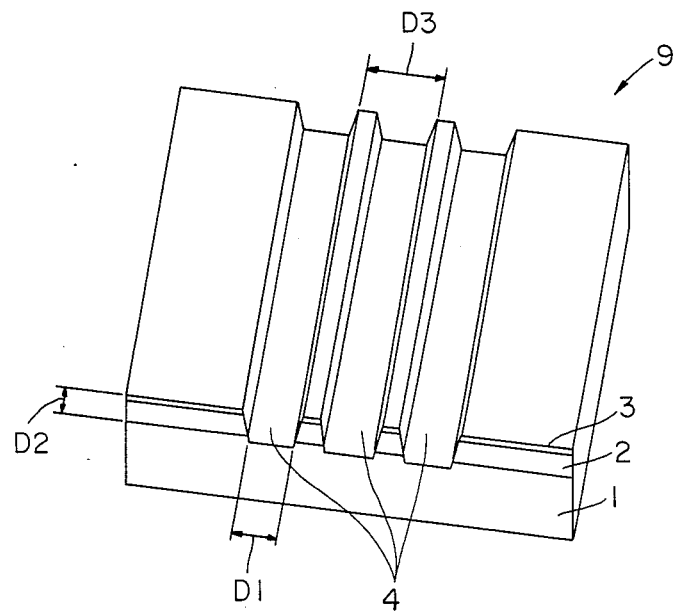
FIGS. 6 and 7, respectively, are a perspective view and a front sectional view showing a conventional semiconductor laser array device.
Figure 7:
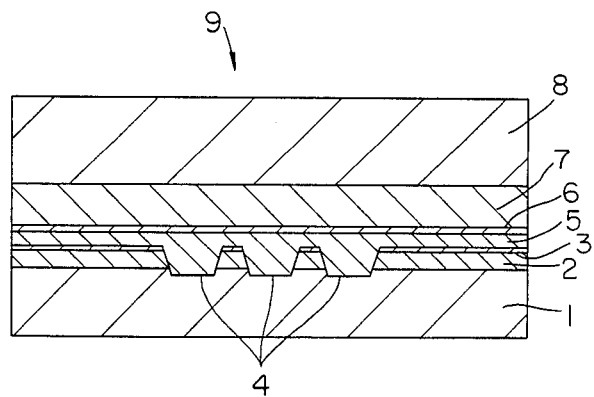
Figure 8:
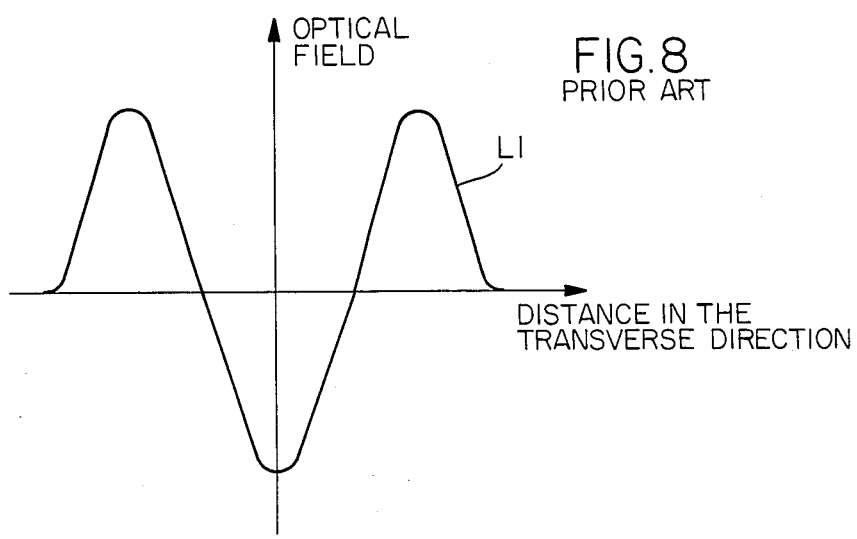
FIG. 8 is a graph showing the optical field distribution of the conventional semiconductor laser array device shown in FIG. 6.
Figure 9:
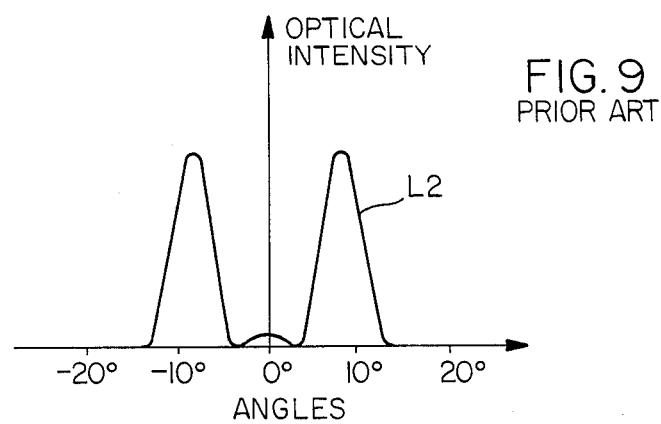
FIG. 9 is a graph showing the far-field pattern of the conventional semiconductor laser array device shown in FIG. 6.
Figure 10:
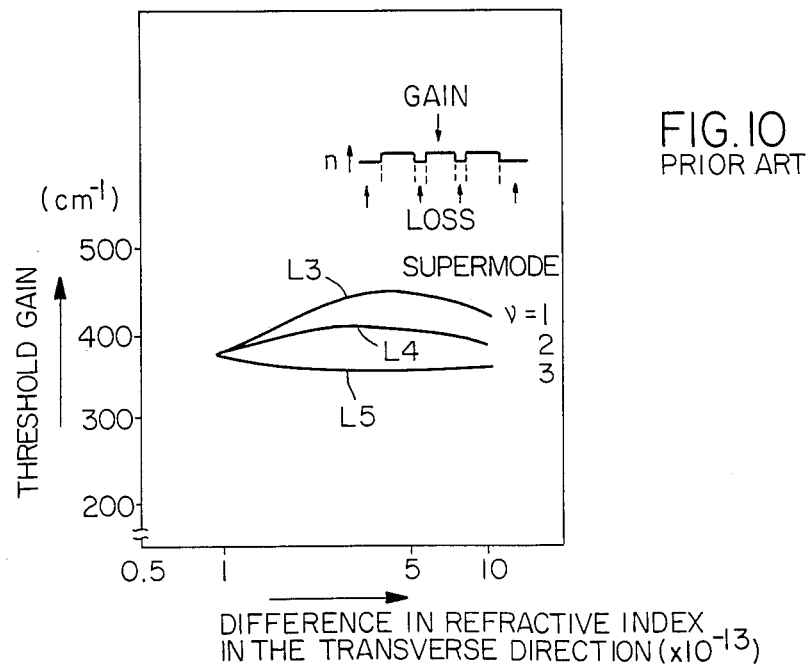
FIG. 10 is a graph showing the theoretical analysis of array mode threshold gain of the conventional semiconductor laser array device shown in FIG. 6.

The reason why the semiconductor laser array device 10 oscillates laser light with a single beam is as follows: FIG. 3 shows the phase relationship between the adjacent opticalwaves at one facet of the laser array device. At the faces A1, A2 and A3 which are at right angles to the index-waveguides M1, M2 and M3 formed within the active layer 16 corresponding to the three channels 141, 142 and 143, the phase shift of the optical field between the adjacent index-waveguides is 180°. That is, the optical field phase at A1 is the same as that of A3, while that of A2 is reciprocal with regard to those of A1 and A3. The opticalwaves are propagated to the areas (i.e., faces B1, B2 and B3) of the index-waveguides M1, M2 and M3, which are at right angles to the facet. Since the index-waveguides M1–M3 are positioned at the angle β from a line perpendicular to the facet, the optical fields of the three index-waveguides M1, M2 and M3 exhibit the same phase at the faces B1, B2 and B3. The opticalwaves are then propagated in the direction perpendicular to the facet at the faces C1, C2 and C3 as shown in FIG. 4, and then are emitted outside of the device 10 from the facet of the device 10 in a single-beam fashion, exhibiting a far-field pattern having a single peak as shown in FIG. 5. The laser array device 10 oscillating such a single beam is useful in practical use.

The inventors of this invention obtained experimental data showing that when the length of the inclined area of each of the index-waveguides M1–M3 was 210 μm, the length of the remaining area, which is vertical to the facet, of each of the index-waveguides M1–M3 was 20 μm, and the angle β of the inclination of said inclined area was approximately 1.8°, the laser array device 10 attained a reproducible high output power and a reproducible output light with a single beam.

The value of the angle β of the inclination of the index-waveguides M1–M3 can be obtained by substituting the following equations (3), (4) and (5) in the above-mentioned equation (2):

$$l_3 = 5 \text{ μm} \quad (3)$$

$$\lambda_0 = 0.78 \text{ μm} \quad (4)$$

$$N_{eff} = 3.45 \quad (5)$$

The semiconductor laser array device of this invention can be constructed by not only the AlGaAs/GaAs system disclosed in the above-mentioned example, but also the other semiconductor materials such as the InGaAsP/InP system, etc. The index-waveguides can be designed to be provided with not only the VSIS type structure disclosed in the above-mentioned example, but also a gain-guided type structure, a CS type structure, etc. The semiconductor laser array device of this invention can be designed to be provided with a structure having a different polarity from the polarity of each of the substrate and the grown layers in the above-mentioned example.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser array device comprising a plurality of index-waveguides in a parallel manner, said index-waveguides are at an angle of inclination from a line perpendicular to each of both facets of the laser array device, and both end portions of each of said index-waveguides are at right angles to the facets.

* * * * *